(12) United States Patent
Heiman et al.

(10) Patent No.: US 8,019,615 B2
(45) Date of Patent: Sep. 13, 2011

(54) METHOD AND SYSTEM FOR DECODING GSM SPEECH DATA USING REDUNDANCY

(75) Inventors: Arie Heiman, Rannana (IL); Arkady Molev-Shteiman, Bney Barak (IL)

(73) Assignee: Broadcom Corporation, Irvine, CA (US)

( * ) Notice: Subject to any disclaimer, the term of this patent is extended or adjusted under 35 U.S.C. 154(b) by 1355 days.

(21) Appl. No.: 11/490,459

(22) Filed: Jul. 20, 2006

(65) Prior Publication Data

US 2006/0259297 A1 Nov. 16, 2006

Related U.S. Application Data

(63) Continuation-in-part of application No. 11/325,721, filed on Jan. 5, 2006, which is a continuation-in-part of application No. 11/189,509, filed on Jul. 26, 2005.

(60) Provisional application No. 60/752,705, filed on Dec. 21, 2005, provisional application No. 60/603,148, filed on Aug. 20, 2004.

(51) Int. Cl.
*G10L 21/00* (2006.01)
*G10L 21/04* (2006.01)

(52) U.S. Cl. ........ 704/503; 704/201; 704/500; 370/280; 370/509

(58) Field of Classification Search ............... 704/503
See application file for complete search history.

(56) References Cited

U.S. PATENT DOCUMENTS 6,917,629 B1 * 7/2005 Ramesh et al. ............... 370/509
2004/0193407 A1 * 9/2004 Ramabadran et al. ........ 704/207

* cited by examiner

*Primary Examiner* — Justin Rider
(74) *Attorney, Agent, or Firm* — McAndrews, Held & Malloy, Ltd.

(57) ABSTRACT

Aspects of a method and system for decoding GSM speech data using redundancy are provided. A decoding algorithm in a frame process may be utilized to generate a bit-sequence for GSM speech data received via a burst process. The decoding algorithm may be a modified Viterbi algorithm, for example. The frame process may comprise verifying a CRC for the bit-sequence and/or decrypting the bit-sequence. In some instances, estimates of the bit-sequence may be fed back to the decoding algorithm. A speech stream that satisfies speech constraints may be generated based on the generated bit-sequence. The speech constraints may comprise gain and/or pitch continuity, for example. The generated speech stream may be decoded via a voice decoder that supports full rate (FR), adaptive multi-rate (AMR), and/or enhanced full-rate (EFR) speech coding. Frame process results may be fed back to the burst process to improve decoding of received GSM speech data.

21 Claims, 14 Drawing Sheets

US 8,019,615 B2

METHOD AND SYSTEM FOR DECODING GSM SPEECH DATA USING REDUNDANCY

CROSS-REFERENCE TO RELATED APPLICATIONS/INCORPORATION BY REFERENCE

This application is a continuation-in-part of U.S. patent application Ser. No. 11/325,721, filed Jan. 5, 2006, which is a continuation-in-part of U.S. patent application Ser. No. 11/189,509, filed Jul. 26, 2005. Said U.S. patent application Ser. No. 11/325,721 and said U.S. patent application Ser. No. 11/189,509, respectively, make reference to, claim priority to, and claim the benefit of U.S. Provisional Application Ser. No. 60/752,705 filed Dec. 21, 2005 and U.S. Provisional Application Ser. No. 60/603,148 filed Aug. 20, 2004.

This patent application also makes reference to U.S. patent application Ser. No. 11/189,634 filed on Jul. 26, 2005.

Each of the above stated applications is hereby incorporated by reference in its entirety.

FIELD OF THE INVENTION

Certain embodiments of the invention relate to data processing in wireless communication systems. More specifically, certain embodiments of the invention relate to a method and system for decoding GSM speech data using redundancy.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, receiver optimization for wireless systems such as global system for mobile communication (GSM) and general packet radio systems (GPRS) may consider the characteristics of Gaussian minimum shift keying (GMSK) modulation, while receiver optimization for enhanced data rate for GSM evolution (EDGE) systems may consider the characteristics of eight phase shift keying (8-PSK) modulation. In this regard, consideration may be given to, for example, the fact that EDGE system receivers may need to provide three times higher nominal bit rates than GSM receivers systems as 8-PSK modulation transmits three bits-per-symbol in contrast to one bit-per-symbol for GMSK modulation. Improvements in the design and implementation of optimized receivers for decoding convolutional encoded data may require modifications to the various algorithms used by these receivers.

Optimization of a receiver system may also be based on whether the signals being received, generally in the form of successive symbols or information bits, are interdependent. Signals received from, for example, a convolutional encoder, may be interdependent signals, that is, signals with memory. In this regard, a convolutional encoder may generate non-return-to-zero inverted (NRZI) or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for decoding GSM speech data using redundancy, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for decoding GSM speech data using redundancy. Aspects of the invention may comprise a decoding algorithm in a frame process that may be utilized to generate a bit-sequence for GSM speech data received via a burst process. The decoding algorithm may be a modified Viterbi algorithm, for example. The frame process may comprise verifying a CRC for the bit-sequence and/or decrypting the bit-sequence. In some instances, estimates of the bit-sequence may be fed back to the decoding algorithm. A speech stream that satisfies speech constraints may be generated based on the generated bit-sequence. The speech constraints may comprise gain and/or pitch continuity, for example. The generated speech stream may be decoded via a voice decoder that supports full rate (FR), adaptive multi-rate (AMR), and/or enhanced full-rate (EFR) speech coding. Frame process results may be fed back to the burst process to improve decoding of received GSM speech data.

Figure 1A:
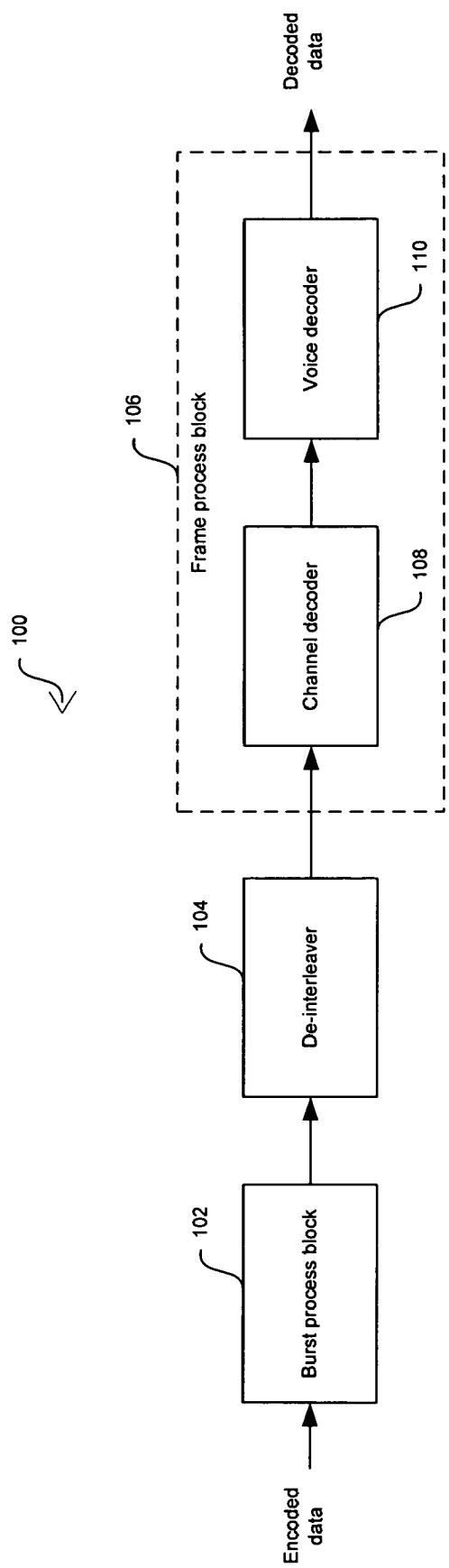
FIG. 1A is a block diagram illustrating a multilayer system for processing GSM speech data, in accordance with an embodiment of the invention.

FIG. 1A is a block diagram illustrating a multilayer system for processing GSM speech data, in accordance with an embodiment of the invention. Referring to FIG. 1A, there is shown a receiver 100 that comprises a burst process block 102, a de-interleaver 104, and a frame process block 106. The frame process block 106 may comprise a channel decoder 108 and a voice decoder 110. The receiver 100 may comprise suitable logic, circuitry, and/or code that may enable operation as a wired or wireless receiver. In this regard, the receiver 100 may be utilized in global system for mobile communication (GSM) applications and in extensions of GSM such as general packet radio systems (GPRS) systems and/or enhanced data rate for GSM evolution (EDGE), for example. The receiver 100 may enable utilization of redundancy to decode interdependent signals, such as signals that comprise convolutional encoded data, for example. The receiver 100 may also enable a multilayer approach for improving the decoding of interdependent signals or signals with memory. In this regard, the receiver 100 may enable a burst process and/or a frame process when processing the received interdependent signals. The multilayer approach performed by the receiver 100 may be compatible with a plurality of modulation standards, such as GMSK modulation and/or 8-PSK modulation utilized in GSM applications, for example.

The burst process block 102 may comprise suitable logic, circuitry, and/or code that may enable performing the burst process portion of the decoding operation, which may be done at the receiver 100. The encoded data received by the burst process block 102 may comprise successive symbols or information bits, for example. For example, in applications that support 8-PSK modulation the encoded data may be in the form of successive 3-bit symbols, while in applications that support GMSK modulation the encoded data may be in the form of successive 1-bit symbols. The burst process block 102 may comprise, for example, a channel estimation operation and/or a channel equalization operation. Results from the channel estimation operation may be utilized by the channel equalization operation to generate a plurality of data bursts based on a maximum-likelihood sequence estimation (MLSE) operation, for example. The output of the burst process block 102 may be transferred to the de-interleaver 104. The de-interleaver 104 may comprise suitable logic, circuitry, and/or code that may enable multiplexing bits from a plurality of data bursts received from the burst process block 102 to form the frame inputs to the frame process block 106. Interleaving may be utilized to reduce the effect of channel fading distortion, for example.

The channel decoder 108 in the frame process block 106 may comprise suitable logic, circuitry, and/or code that may enable decoding the bit sequences in the input frames received from the de-interleaver 104. The channel decoder 108 may be adapted to utilize the Viterbi algorithm during a Viterbi operation to improve the decoding of the input frames. The voice decoder 110 may comprise suitable logic, circuitry, and/or code that may enable content specific processing operations on the results of the channel decoder 108 for specified speech and/or voice applications. For example, the voice decoder 110 may be utilized in applications enhanced full-rate (EFR) or adaptive multi-rate (AMR) speech coding used in GSM, for example.

In operation, burst processing may be provided as a first processing layer on received encoded GSM speech data by the burst process block 102. The de-interleaver 104 may multiplex the results generated by the burst process block 102 for generate the appropriate data frames for the frame process block 106. The frame processing provided by the channel decoder 108 and/or the voice decoder 110, in the frame process block 106, may correspond to a second processing layer provided by the receiver 100. The output of the frame process block 106 may be decoded voice or speech data. The operations provided by the receiver 100 may be optimized for GSM applications that utilize 8-PSK modulation or GMSK modulation, for example.

Regarding the frame processing provided by the channel decoder 108 and/or the voice decoder 110, a standard approach for decoding convolutional encoded data may be to find the maximum-likelihood sequence estimate (MLSE) for a bit sequence. This may involve searching for a sequence X in which the conditional probability $P(X/R)$ is a maximum, where X is the transmitted sequence and R is the received sequence, by using, for example, the Viterbi algorithm. In some instances, the received signal R may comprise an inherent redundancy as a result of the encoding process performed by the source of the signal. This inherent redundancy may be utilized in the decoding process by developing a MLSE algorithm that may enable meeting at least some of the physical constrains of the signal's source. The use of physical constraints in the MLSE may be expressed as finding a maximum of the conditional probability $P(X/R)$, where the sequence X meets a set of physical constrains $C(X)$ and the set of physical constrains $C(x)$ may depend on the source type and on the application. In this regard, the source type may be a speech and/or a voice source, for example.

In an exemplary embodiment of the invention for speech applications, physical constraints may include gain continuity and smoothness in inter-frames or intra-frames, pitch continuity in voice inter-frames or intra-frames, and/or consistency of line spectral frequency (LSF) parameters that are utilized to represent a spectral envelope. The U.S. application Ser. No. 11/189,509 filed on Jul. 26, 2005, which discloses a method and system decoding video, voice, and speech using redundancy, provides exemplary physical constraints for video, voice, and speech applications and is hereby incorporated herein by reference in its entirety.

In an exemplary embodiment of the invention for speech applications such as GSM voice transmission applications, such as AMR or EFR, the physical constraints may be similar to those utilized in general speech applications. That is, the physical constraints in GSM applications may comprise gain continuity and smoothness in inter-frames or intra-frames, pitch continuity in voice inter-frames or intra-frames, continuity of LSF parameters and format locations that are utilized to represent speech. Moreover, GSM applications may utilize redundancy, such as in CRC, as a physical constraint. For example, in GSM applications, enhanced full rate (EFR) coding may utilize 8 bits and 3 bits for CRC, adaptive multi-rate (AMR) coding may utilize 6 bits for CRC, and GSM half rate (GSM-HR) may utilize 3 bits for CRC.

Another approach for decoding convolutional encoded data may be to utilize a maximum a posteriori probability (MAP) algorithm. This approach may utilize a priori statistics of the source bits such that a one-dimensional a priori probability, $p(b_i)$, may be generated, where $b_i$ corresponds to a current bit in the bit sequence to be encoded. To determine the MAP sequence, the Viterbi transition matrix calculation may need to be modified. This approach may be difficult to implement in instances where complicated physical constraints and when the correlation between bits $b_i$ and $b_j$, where i and j are far apart, may not be easily determined. In cases where a parameter domain has a high correlation, the MAP algorithm may be difficult to implement. Moreover, the MAP algorithm may not be utilized in cases where inherent redundancy, such as for CRC, is part of the physical constraints.

The maximum-likelihood sequence estimate (MLSE) for a symbol or bit sequence may be a preferred approach for decoding convolutional encoded data. A general solution for the maximum of the conditional probability $P(X/R)$, where R meets a certain set of physical constraints $C(X)$, for the MLSE may still be difficult implement. In this regard, an efficient solution may require a suboptimal solution that takes into consideration complexity and implementation of the physical constraints.

Figure 1B:
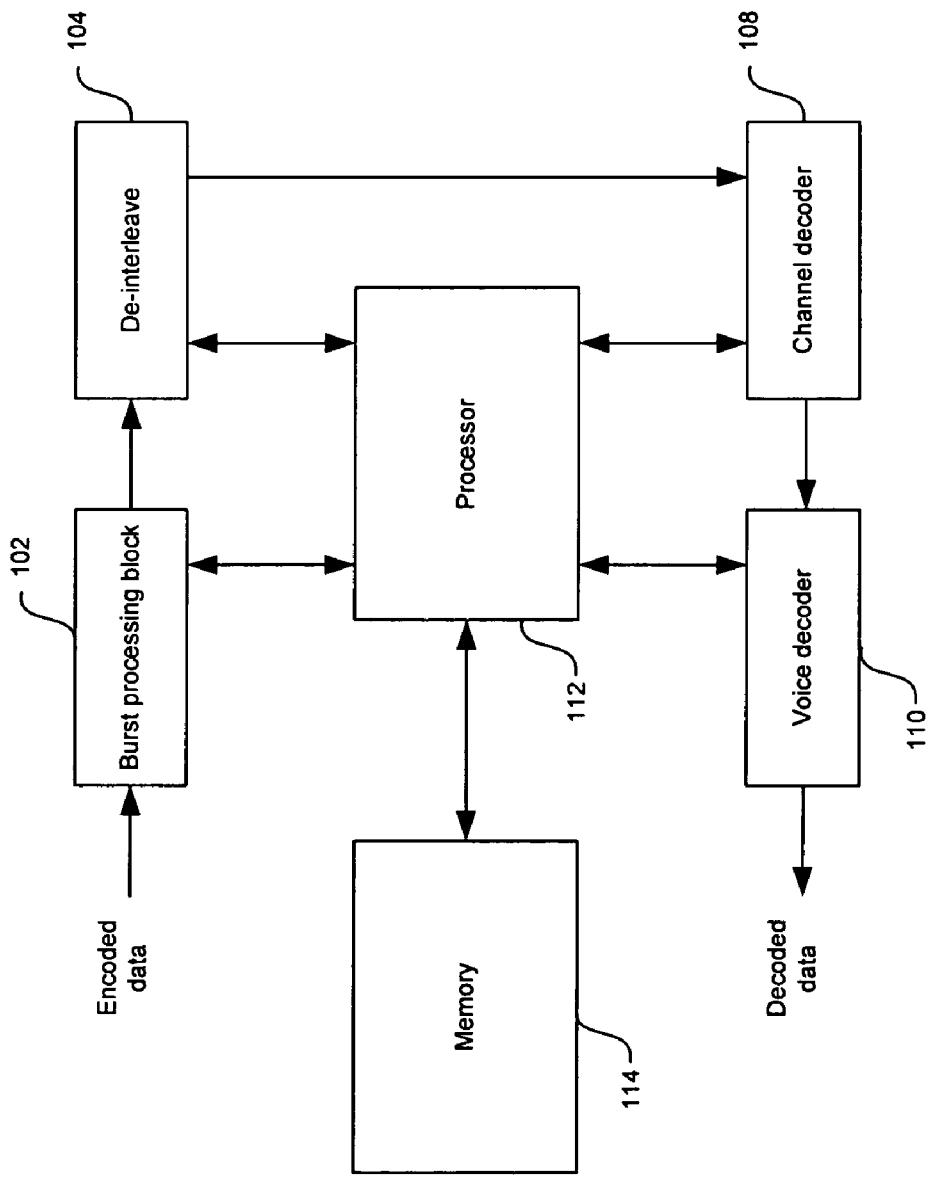
FIG. 1B is a block diagram illustrating a multilayer system comprising a processor and memory for processing GSM speech data, in accordance with an embodiment of the invention.

FIG. 1B is a block diagram illustrating a multilayer system comprising a processor and memory for processing GSM speech data, in accordance with an embodiment of the invention. Referring to FIG. 1B, there is shown a processor 112, a memory 114, the burst process block 102, a de-interleaver 104, the channel decoder 108 and the media decoder 110. The processor 112 may comprise suitable logic, circuitry, and/or code that may enable computations and/or management operations. The processor 112 may also enable communication with and/or control of at least a portion of the operations provided by the burst process block 102, the de-interleaver 104, the channel decoder 108 and/or the media decoder 110. The memory 114 may comprise suitable logic, circuitry, and/or code that may enable storage of data and/or control information. The memory 114 may enable storage of information that may be utilized and/or that may be generated by the burst process block 102, the de-interleaver 104, the channel decoder 108, and/or the media decoder 110. In this regard, information may be transferred to and/or from the memory 114 via the processor 112, for example.

When more than one application is supported by the system in FIG. 1B, the processor 112 may be utilized to adapt and/or modify the operations of the burst process block 102, the de-interleaver 104, the channel decoder 108, and/or the media decoder 110. For example, when GMSK and 8-PSK are supported for GSM communication, the processor 112 may adapt and/or modify operations to optimize the decoding of interdependent signals, such as convolutional encoded data. In order to enable such optimization, 8-PSK modulation may be distinguished from other modulation formats, such as the GMSK modulation, for example.

Figure 2A:
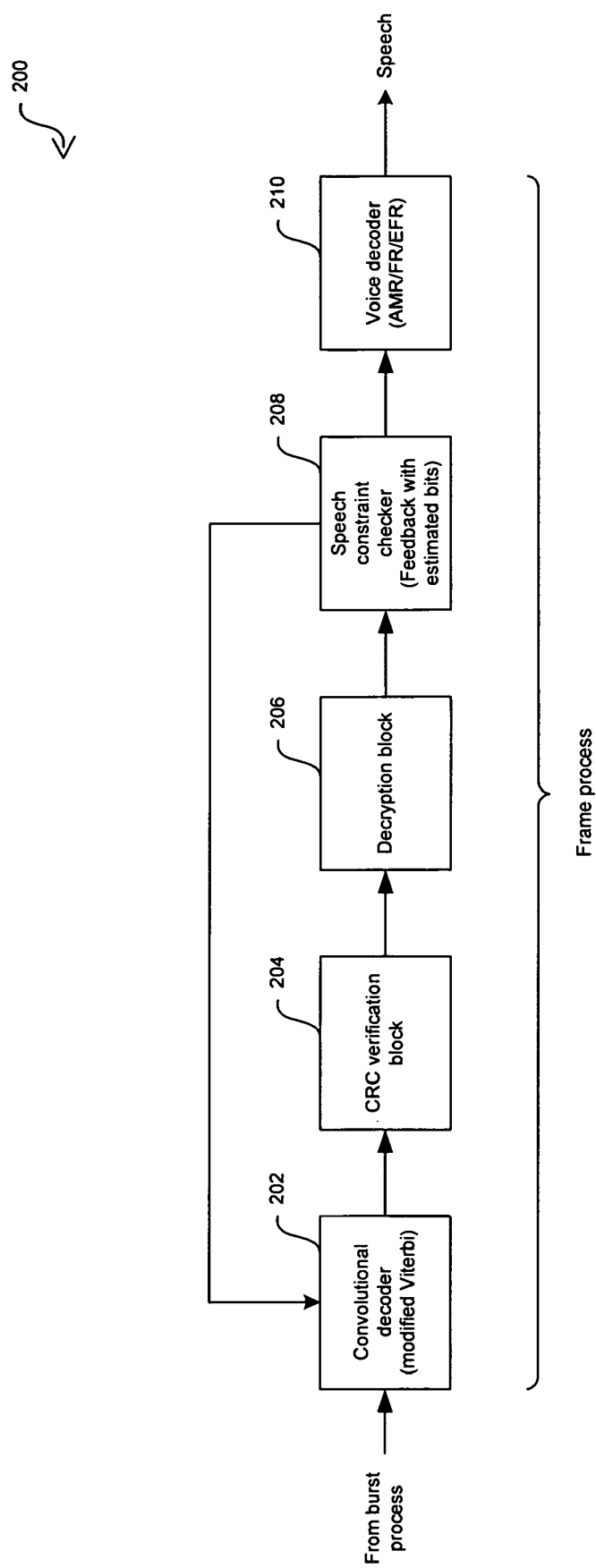
FIG. 2A is a block diagram illustrating an exemplary frame process block, in accordance with an embodiment of the invention.

FIG. 2A is a block diagram illustrating an exemplary frame process block, in accordance with an embodiment of the invention. Referring to FIG. 2A, there is shown the frame process block 200 that may correspond to an exemplary implementation of the frame process block 106 in FIG. 1A. The frame process block 200 may comprise a convolutional decoder 202, a CRC verification block 204, a decryption block 206, a speech constraint checker 208, and an adaptive multi-rate (AMR) voice decoder 210.

The convolutional decoder 202 may comprise suitable logic, circuitry, and/or code that may enable decoding of a data stream received from burst process operations into a decoded bit-sequence, for example. The convolutional decoder 202 may utilize, for example, a modified Viterbi algorithm. The data stream may be, for example, a portion of a GSM speech stream that may have been received by the receiver 100. A GSM-based transmitter may have convolutionally coded the received speech data.

In one embodiment of the invention, information may be fed back from the speech constraint checker 214 to the convolutional decoder 202. The feedback information may enable the convolutional decoder 202 to modify at least a portion of the decoding of the data stream received from the burst process. Other embodiments of the invention need not feed back information from the speech constraint checker 214 to the convolutional decoder 202.

The CRC verification block 204 may comprise suitable logic, circuitry, and/or code that may enable verification of the decoded bit-sequence from the convolutional decoder 202 via a CRC value associated with the speech stream. The verification may comprise, for example, the use of a constraint algorithm. An exemplary constraint algorithm is explained in more detail with respect to FIGS. 5A and 5B. The verified speech stream generated by the CRC verification block 204 may be communicated to the decryption block 206. The decryption block 206 may comprise suitable logic, circuitry, and/or code that may enable decryption of the verified speech stream from the CRC verification block 204. The decryption operation may comprise, for example, exclusive-ORing at least a portion of the speech stream with a decryption key. The decryption key may be, for example, the same as the encryption key that may have been utilized to encrypt the transmitted data.

The speech constraint checker 208 may comprise suitable logic, circuitry, and/or code that may enable testing the speech stream for compliance with at least one specified physical constraint such as a speech constraint, for example. Speech constraints may comprise gain continuity and smoothness in inter-frames or intra-frames, pitch continuity in voice inter-frames or intra-frames, and/or consistency of line spectral frequency (LSF) parameters that are utilized to represent a spectral envelope, for example. In some instances, the speech constraint checker 208 may feed back information regarding whether the decrypted speech stream from the decryption block 206 complies with the appropriate speech constraint. When the decrypted speech stream complies with the appropriate speech constraint, the speech constraint checker 208 may communicate the speech stream to the voice decoder 210 for decoding.

The voice decoder 210 may comprise suitable logic, circuitry, and/or code that may enable decoding of the constraint-compliant encoded speech stream from the speech constraint checker 208. The voice decoder 210 may be utilized in TDMA speech applications such as, for example, GSM speech decoding. In this regard, the voice decoder 210 may support decoding of at least one of a full rate (FR) speech coding, an enhanced full rate (EFR) speech coding, and an advanced multi-rate (AMR) speech coding. The output of the voice decoder 210 may be digital speech data that may be converted to an analog signal. The analog signal may be played as audio sound via a speaker, for example.

In AMR speech coding applications, the voice decoder 210 may receive a variable number of bits for decoding depending on the transmission rate chosen by a base station. The receiver 100 may communicate with one or more base stations (not shown), and the base stations may communicate the transmit rate to the receiver 100. For example, AMR applications for GSM third generation (3G) mobile telephony may be based on an algebraic code excited linear prediction (ACELP) compression method and may operate at eight different bit or coding rates, such as, 12.2 kbps, 10.2 kbps, 7.95 kbps, 7.40 kbps, 6.7 kbps, 5.9 kbps, 5.15 kbps, and 4.75 kbps. Other techniques utilized in AMR applications may comprise discontinuous transmission (DTX), voice activity detection (VAD) and comfort noise generation (CNG), for example. AMR applications may utilize bitstreams based on frames.

In FR speech coding applications, the voice decoder 210 may receive speech information at a 13 kbps transmission rate. FR speech coding applications may be supported by the voice decoder 210 because they are still widely utilized in many networks around the world. In EFR speech coding application, the voice decoder 210 may receive speech information at a 12.2 kbps transmission rate, which is compatible with AMR's highest mode. The voice decoder 210 may enable support of the GSM AMR, FR, and/or EFR speech coding rates in the frame process block 200.

In operation, the convolutional decoder 202 may receive speech data from burst processing operations. The bit streams output by the convolutional decoder 202 may be communicated to the CRC verification block 204. The CRC verification block 204 may verify whether a CRC may be a valid CRC. The validated bit stream data, which may have the CRC removed, may be communicated to the decryption block 206. When the CRC is not valid, a bad frame indicator (BFI) flag may be asserted to indicate to, for example, the voice decoder 210 that the current speech frame may not be valid. The decryption block 206 may exclusive-OR the data in the bit stream with a decryption key to decrypt the data. The speech constraint checker 208 may verify that the bit stream may meet speech constraints. A speech stream may be communicated from the speech constraint checker 208 to the voice decoder 210. The speech constraint checker 208 may also communicate a BFI flag to the voice decoder 210 when the current frame does not comply with the speech constraints. If the BFI flag is unasserted, the voice decoder 210 may decode the bit stream to digital data that may be converted to an analog voice signal. If the BFI flag is asserted, the bit stream may be ignored.

In an embodiment of the invention, the speech constraint checker 208 may communicate a feedback signal to the convolutional decoder 202. The feedback signal may be, for example, an estimated value of a current speech parameter that may be fed back to the convolutional decoder 202, which may be, for example, the modified Viterbi decoder. Other embodiments of the invention need not have a feedback loop from the speech constraint checker 208 to the convolution decoder 202.

Figure 2B:
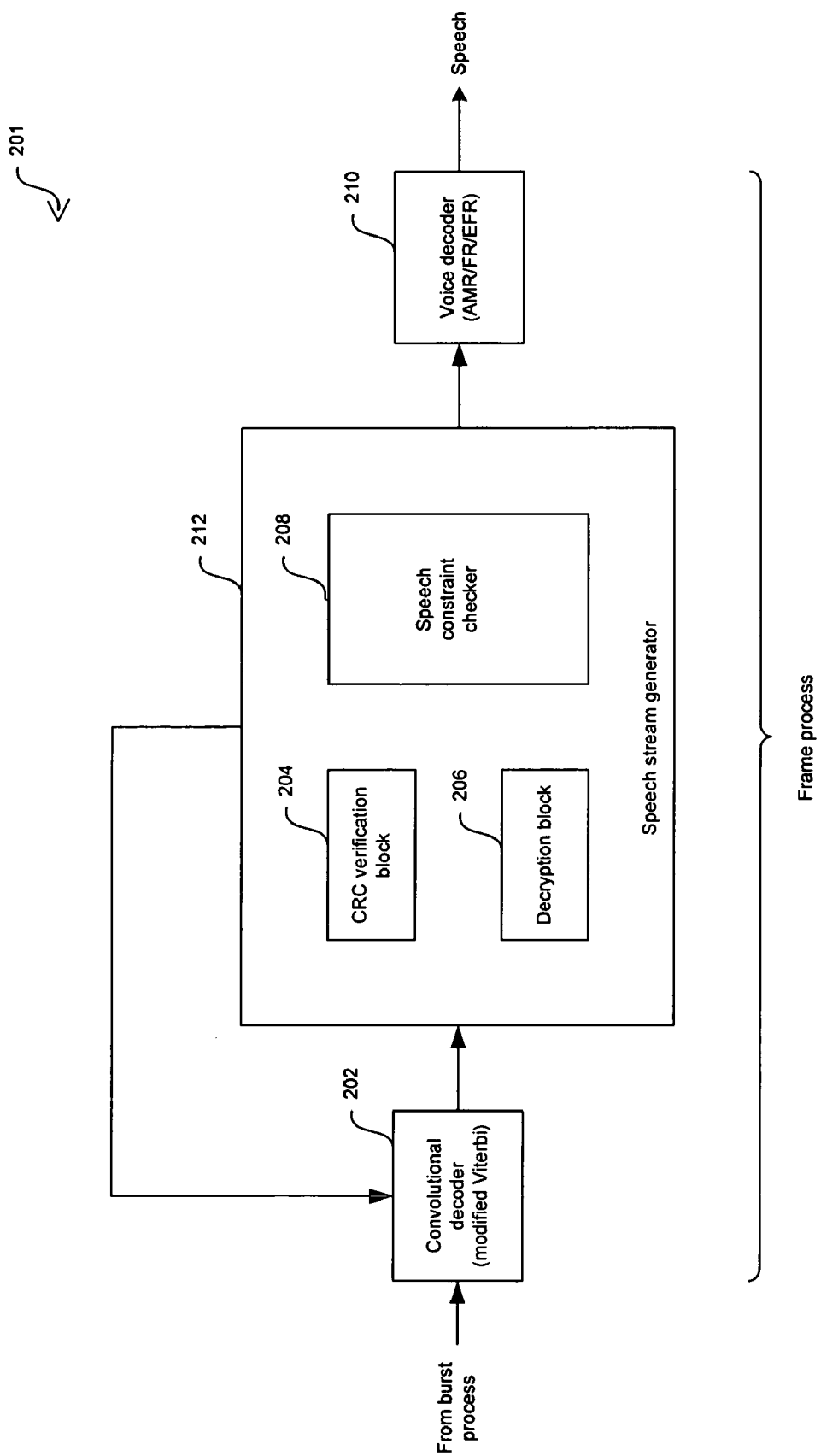
FIG. 2B is a block diagram illustrating the exemplary frame process block shown in FIG. 2A with integrated components, in accordance with an embodiment of the invention.

FIG. 2B is a block diagram illustrating the exemplary frame process block shown in FIG. 2A with integrated components, in accordance with an embodiment of the invention. Referring to FIG. 2B, there is shown a frame process block 201 that may correspond to an exemplary implementation of the frame process block 200 in FIG. 2A. In this regard, the operation of the frame process block 201 may be substantially similar to the operation of the frame process block 200 in FIG. 2A.

The frame process block 201 may comprise the convolutional decoder block 202, which may be a modified Viterbi decoder, and the voice decoder 210 shown in FIG. 2A. The frame process block 201 may also comprise a speech stream generator 212. The speech stream generator 212 may comprise the CRC verification block 204, the decryption block 206, and a speech constraint checker 208. In some instances, the CRC verification block 204, the decryption block 206, and the speech constraint checker 208 may be integrated into a single component, for example.

The speech constraint checker 208 may enable estimation of a value of a current speech parameter where encoded bits may be fed back from the speech stream generator 212 to the convolutional decoder 202, which may be, for example, a modified Viterbi decoder. However, the invention need not be so limited. For example, some embodiments of the invention need not have a feedback loop from the speech constraint checker 208 to the convolutional decoder 202.

Figure 3:
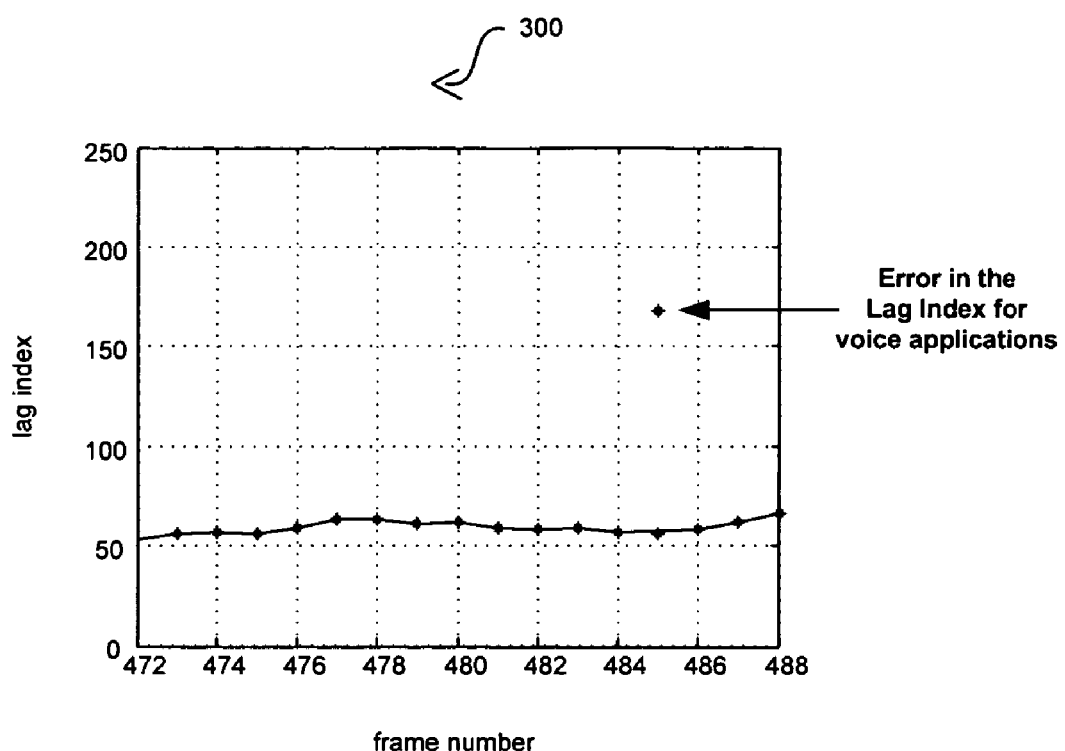
FIG. 3 is a diagram illustrating irregularity in pitch continuity voice frames, which may be utilized in association with an embodiment of the invention.

FIG. 3 is a diagram illustrating irregularity in pitch continuity in voice frames, which may be utilized in association with an embodiment of the invention. Referring to FIG. 3, there is shown a plot 400 illustrating a lag index or pitch continuity as a function of frame number with a non-physical pitch in frame 485 due to bit error. In instances where the lag index may comprise a continuity that results from physical constraints in speech, applying a physical constraint to the decoding operation of the lag index may reduce decoding errors.

For certain data formats, for example, the inherent redundancy of the physical constraints may result from the packaging of the data and the generation of a redundancy verification parameter, such as a cyclic redundancy check (CRC), for the packaged data. Moreover, decoding data generated by entropy encoders or variable length coding (VLC) operations may also meet some internal constraints. For example, VLC operations utilize a statistical coding technique where short codewords may be utilized to represent values that occur frequently and long codewords may be utilized to represent values that occur less frequently.

Figure 4:
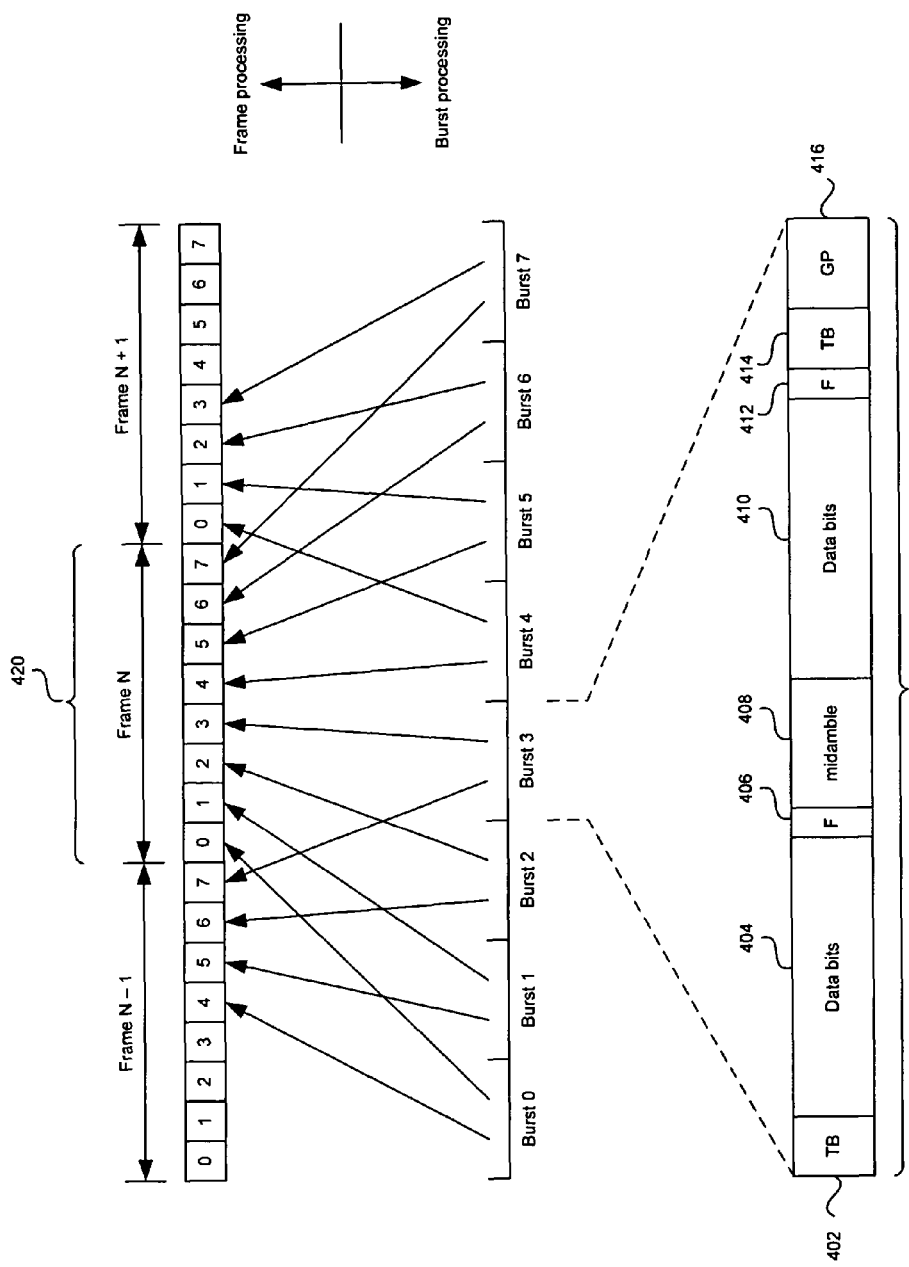
FIG. 4 is a diagram illustrating exemplary combined frame and burst processes in GSM applications, in accordance with an embodiment of the invention.

FIG. 4 is a diagram illustrating exemplary combined frame and burst processes in GSM applications, in accordance with an embodiment of the invention. Referring to FIG. 4, there is shown for GSM applications utilizing GMSK modulation, a series of at least one time slot burst 400 and a series of at least one frame 420. The series of at least one time slot burst 400, as shown, may correspond to Burst 0 through Burst 7, while the series of at least one frame 420, as shown, may correspond to Frame N−1 through Frame N+1. The series of at least one time slot burst 400 may be generated during the burst processing of the receiver 100 in FIG. 1A, while the series of at least one frame 420 may be generated during the frame processing of the receiver 100. The frame processing may be performed by, for example, the frame process blocks 200 and 201 in FIG. 2A and FIG. 2B respectively. The time slot burst 400 may comprise a tail bit (TB) 402, first data bits 404, a flag bit (F) 406, a midamble 408, second data bits 410, a flag bit (F) 412, a tail bit (TB) 414, and guard bits (GP) 416. The TB 402 and the TB 414 may comprise 3 bits each. The first data bits 404 and the second data bits 410 may comprise 57 bits each. The F 406 and the F 412 flag bits may comprise 1 bit each. The midamble 408 may comprise 26 bits and may be utilized as a training sequence for channel equalization, for example. For GSM applications utilizing 8-PSK modulation, such as EDGE, for example, the time slot burst 400 may be mapped to a 156-symbol or to a 157-symbol EDGE time slot burst. The frame 420 may comprise eight partitions or sequences of bits.

As shown, the first data bits 404 in the Burst 0 through Burst 3 may be transferred to the fifth, sixth, seventh, and eight sequences of the Frame N−1 respectively, for example. The first data bits 404 in the Burst 4 through Burst 7 may be transferred to the fifth, sixth, seventh, and eight sequences of the Frame N respectively, for example. The second data bits 410 in the Burst 0 through Burst 3 may be transferred to the first, second, third, and fourth sequences of the Frame N respectively, for example. The second data bits 410 in the Burst 4 through Burst 7 may be transferred to the first, second, third, and fourth sequences of the Frame N+1 respectively, for example. The decoding of bit sequences transferred from the time slot bursts in the burst processing to the frames in the frame processing may be performed by utilizing the Viterbi algorithm to reduce the number of sequences utilized during the decoding search. In this regard, utilizing signal redundancy and at least one physical constraint may result in a more accurate decoding operation. The following example illustrates the application of a multilayer solution that efficiently implements physical constraints into the decoding of speech data in GSM applications.

Figure 5A:
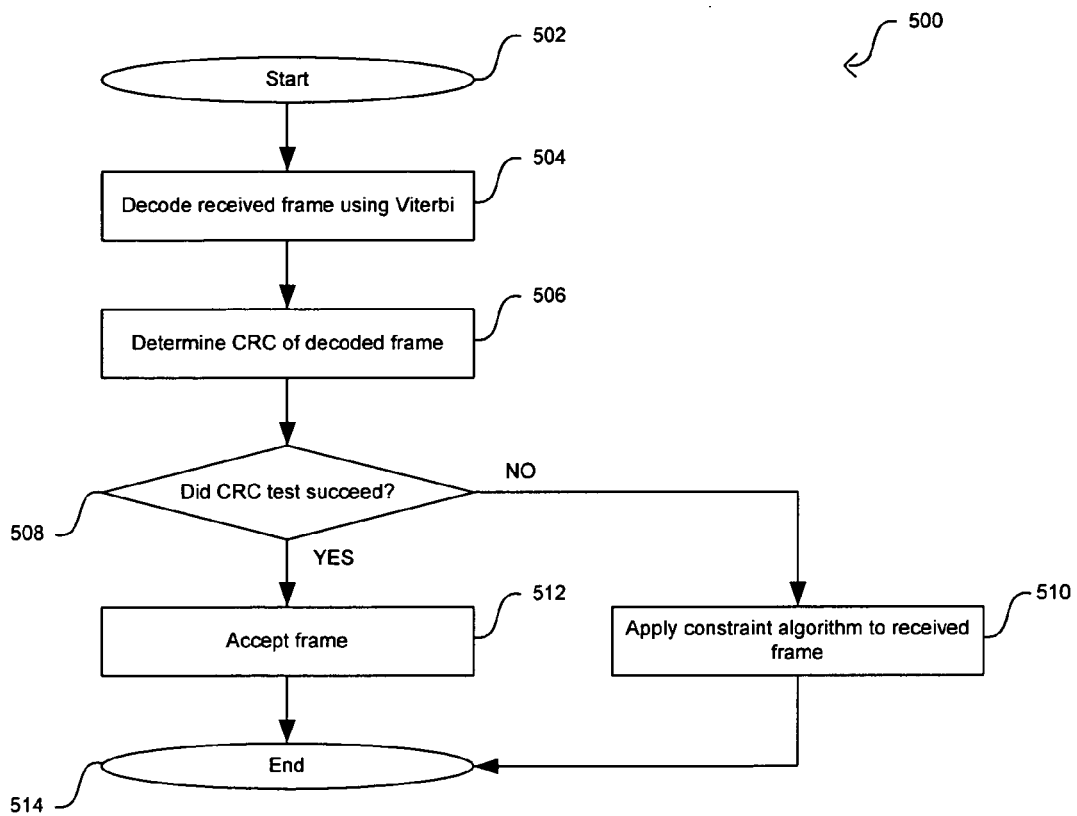
FIG. 5A is a flow diagram illustrating exemplary steps in the application of redundancy to a multilayer process, in accordance with an embodiment of the invention.

FIG. 5A is a flow diagram illustrating exemplary steps in the application of redundancy to a multilayer process, in accordance with an embodiment of the invention. Referring to FIG. 5A, there is shown a flow chart 500. After start step 502, in step 504, the receiver 100 in FIG. 1A may decode a received frame in the frame process block 106 by utilizing the Viterbi algorithm. In step 506, a redundancy verification parameter, such as the CRC, may be determined for the decoded frame. In step 508, the receiver 100 may determine whether the CRC verification test was successful. When the CRC verifies the decoded frame, the receiver 100 may proceed to step 512 where the decoded frame is accepted. After step 512, the receiver 100 may proceed to end step 514.

Returning to step 508, when the CRC verification test is not successful for the decoded frame, the receiver 100 may proceed to step 510. In step 510, the receiver 100 may perform a redundancy algorithm that may be utilized to provide a decoding performance that may result in equal or reduced decoding errors than those that may occur from utilizing the standard Viterbi algorithm. After step 510, the receiver 100 may proceed to end step 514.

For GSM applications, for example, the redundancy algorithm may comprise searching for the MLSE that may also meet the CRC condition and the speech constraints. In this regard, a set of k bit sequences {S1, S2, . . . , Sk} may be determined from the MLSE that meet the CRC constraint. Once the set of k sequences is determined, a best sequence, Sb, may be determined that also meets the GSM voice or speech constraints.

Figure 5B:
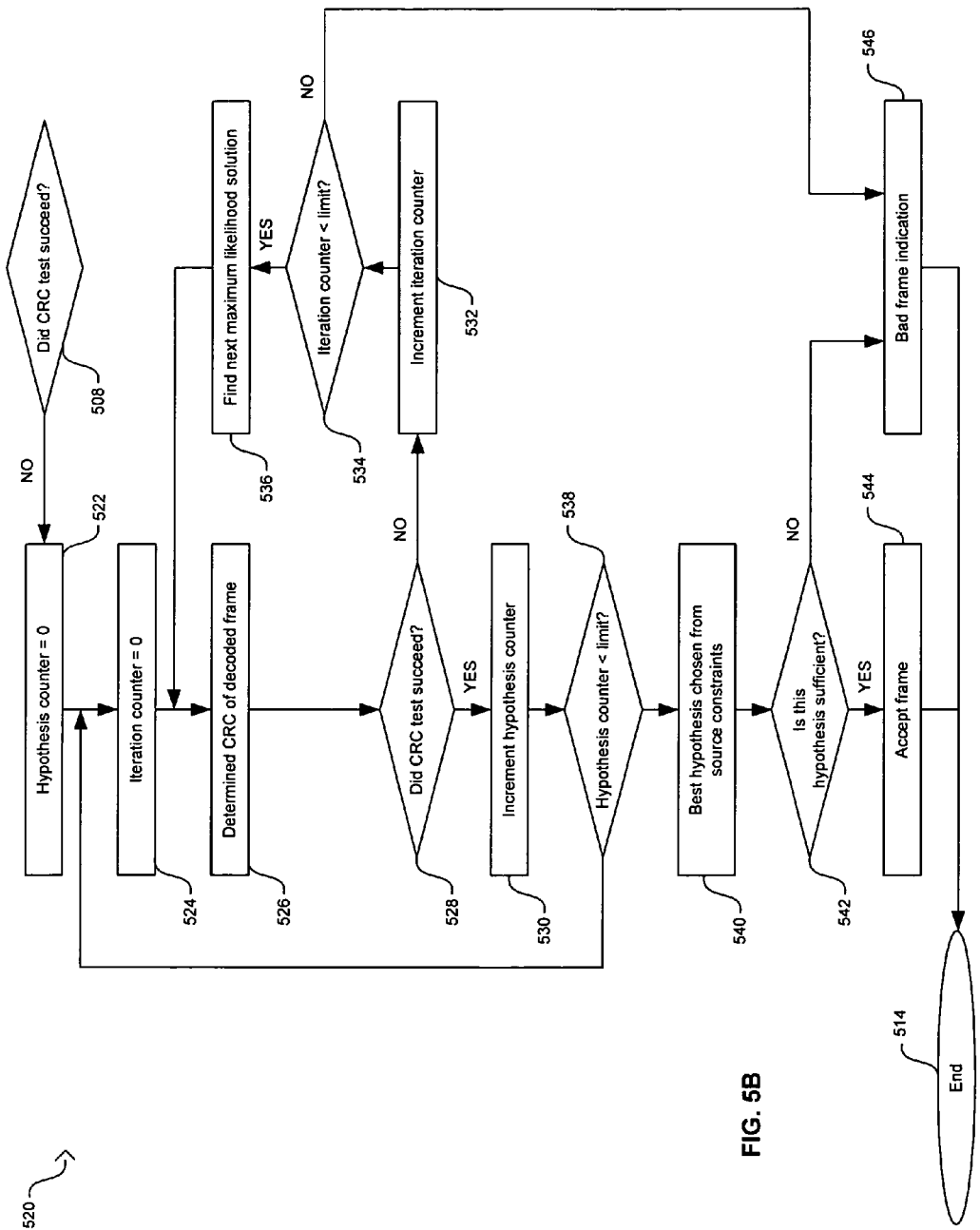
FIG. 5B is a flow diagram illustrating exemplary steps in the application of a constraint algorithm to a received frame, in accordance with an embodiment of the invention.

FIG. 5B is a flow diagram illustrating exemplary steps in the application of a constraint algorithm to a received frame, in accordance with an embodiment of the invention. Referring to FIG. 5B, there is shown a flow chart 520. When the CRC verification test is not successful for the decoded frame in step 508 in FIG. 5A, the receiver 100 in FIG. 1A may proceed to step 522. In step 522, a hypothesis counter may be set to an initial counter value to indicate a first hypothesis for consideration, for example. The initial counter value in step 522 may be zero, for example. After step 522, an iteration counter may be set to an initial counter value in step 524 to indicate a first maximum likelihood solution, for example. The initial counter value in step 524 may be zero, for example. In step 526, the CRC of the decoded frame may be determined.

In step 528, the receiver 100 may determine whether the CRC verification test was successful for the current hypothesis. When the CRC verification test is not successful, the operation may proceed to step 532. In step 532, the iteration counter may be incremented. After step 532, in step 534, the receiver 100 may determine whether the iteration counter is less than a predetermined limit. When the iteration counter is higher or equal to the predetermined limit, the operation may proceed to step 546 where a bad frame indication is generated. When the iteration counter is less than the predetermined limit, the operation may proceed to step 536 where a next maximum likelihood solution may be determined. After step 536, the operation may proceed to step 526 where the CRC of the decoded frame may be determined based on the maximum likelihood solution determined in step 526.

Returning to step 528, when the CRC verification test is successful, the operation may proceed to step 530. In step 530, the hypothesis counter may be incremented. After step 530, in step 538, the receiver 100 may determine whether the hypothesis counter is less than a predetermined limit. When the hypothesis counter is less than the predetermined limit, the operation may proceed to step 524 where the iteration counter may be set to an initial value. When the hypothesis counter is equal the predetermined limit, the operation may proceed to step 540 where the best hypothesis may be chosen from the source constraints.

After step 540, in step 542, the receiver 100 may determine whether the best hypothesis chosen in step 540 is sufficient to accept the decoded frame. When the chosen hypothesis is sufficient to accept the decoded frame, the operation may proceed to step 544 where the decoded frame may be accepted. When the chosen hypothesis is not sufficient to accept the decoded frame, the operation may proceed to step 546 where a bad frame indication is generated. After step 544 or step 546, the operation may proceed to end step 514 in FIG. 5A.

Figure 6A:
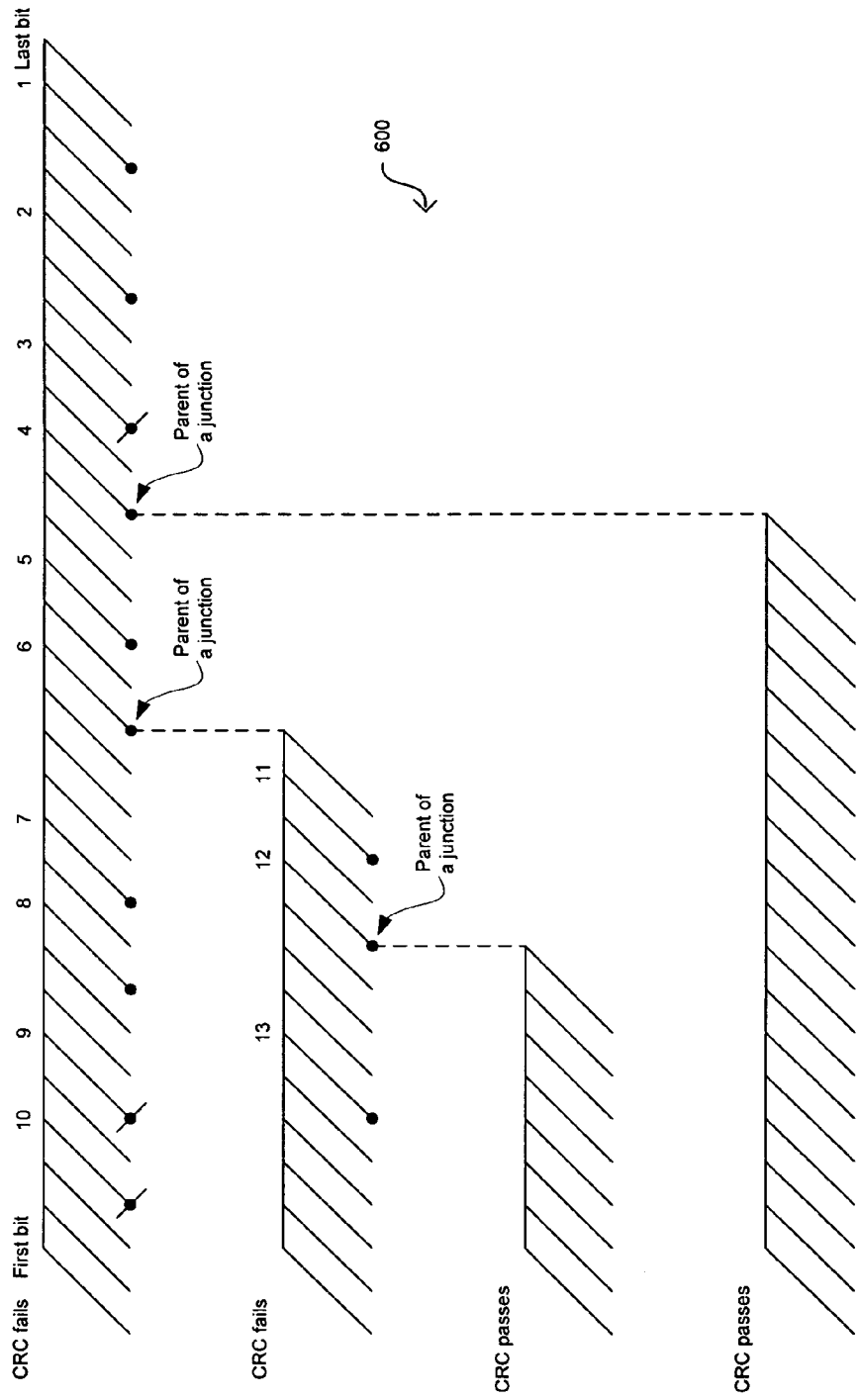
FIG. 6A is diagram illustrating an exemplary search process for a T hypothesis that meets CRC constraint, in accordance with an embodiment of the invention.

FIG. 6A is diagram illustrating an exemplary search process for a T hypothesis that meets CRC constraint, in accordance with an embodiment of the invention. Referring to FIG. 6A, the search tree 600 may correspond to an exemplary sequence search process that may start with the reduced set of estimated bit sequences generated by a Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for GSM may start with the selected trellis junction with the highest metric. In this example, the junction labeled 6 has the highest metric and the search process may start at that point. A new search tree 600 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be selected as one of the bit sequences for the set of k sequences {S1, S2, ..., Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, ..., Sk}. This approach may be followed until the limit of k sequences is exceeded or the search from all the remaining selected junctions is performed. In this regard, a plurality of trace back pointers may be calculated during the search operation. The size of the set of k bit sequences {S1, S2, ..., Sk} may vary.

Trace back pointers may be calculated at each state to track the search process. However, in order to simplify the search process for T hypothesis, the CRC and the trace back pointers for the states may be calculated simultaneously. This approach is possible because the CRC may be calculated as $sum(b_i R_i)$, where $R_i$ is the remainder of $xi/g(x)$, $g(x)$ is the generator polynomial of the CRC, and $b_i$ is the value of the bit i. The CRC metric of each sequence may be kept or stored in the buffer content 520. The CRC metric may be obtained as the sum of the biRi values from the junction to the last bit, and may also be determined as the sum of the parent sequence CRC metric and sum of the biRi values from junction to its parent. The sequence may meet the CRC condition if the CRC metric is equal to the sum of the biRi values from first bit to the junction. The values for $R_i$ may be stored in, for example, a look up table.

Once the set of k sequences {S1, S2, ..., Sk} has been determined, the redundancy algorithm may require that the receiver 100 in FIG. 1A selects one of the bit sequences as the best bit sequence, Sb, that meets the CRC constrain and the physical constrains with the highest level of confidentiality. The best bit sequence may also be referred to as the decoded output bit sequence of the multilayer process.

For each of the candidate bit sequences in the set of k bit sequences {S1, S2, ..., Sk}, a set of T1 different physical constraint tests, {Test(j), ..., Test(T1)}, may be performed. The physical constraint tests correspond to tests of quantifiable characteristics of the type of data received for a particular application. The scores of the physical constraint tests for an $i^{th}$ bit sequence, {T_SC(i, j), ..., T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

TABLE 1

| Candidate | Test (1) | Test (2) | Test (3) | Test (4) |
|---|---|---|---|---|
| S1 | Score(1, 1) < 0 | Score(1, 2) < 0 | Score(1, 3) < 0 | Score(1, 4) < 0 |
| S2 | Score(2, 1) < 0 | Score(2, 2) > 0 | Score(2, 3) < 0 | Score(2, 4) < 0 |
| S3 | Score(3, 1) < 0 | Score(3, 2) < 0 | Score(3, 3) < 0 | Score(3, 4) < 0 |
| S4 | Score(4, 1) < 0 | Score(4, 2) < 0 | Score(4, 3) < 0 | Score(4, 4) > 0 |
| S5 | Score(5, 1) < 0 | Score(5, 2) < 0 | Score(5, 3) < 0 | Score(5, 4) < 0 |
| Minimum score sequence | S3 | S5 | S3 | S3 |

Some characteristic physical constraint tests that may be utilized by, for example, AMR speech coding, FR speech coding, and/or EFR speech coding are LSF parameters, gain, and/or pitch. For the LSF parameters, some of the tests may be based on the distance between two formats, changes in consecutive LSF frames or sub-frames, and the effect of channel metrics on the thresholds. For example, the smaller the channel metric, the more difficult it may be to meet the threshold. Regarding the use of gain as a physical constraint test, the criteria may be smoothness or consistency between consecutive frames or sub-frames, for example. Regarding pitch, the criteria may be the difference in pitch between frames or sub frames, for example.

Figure 6B:
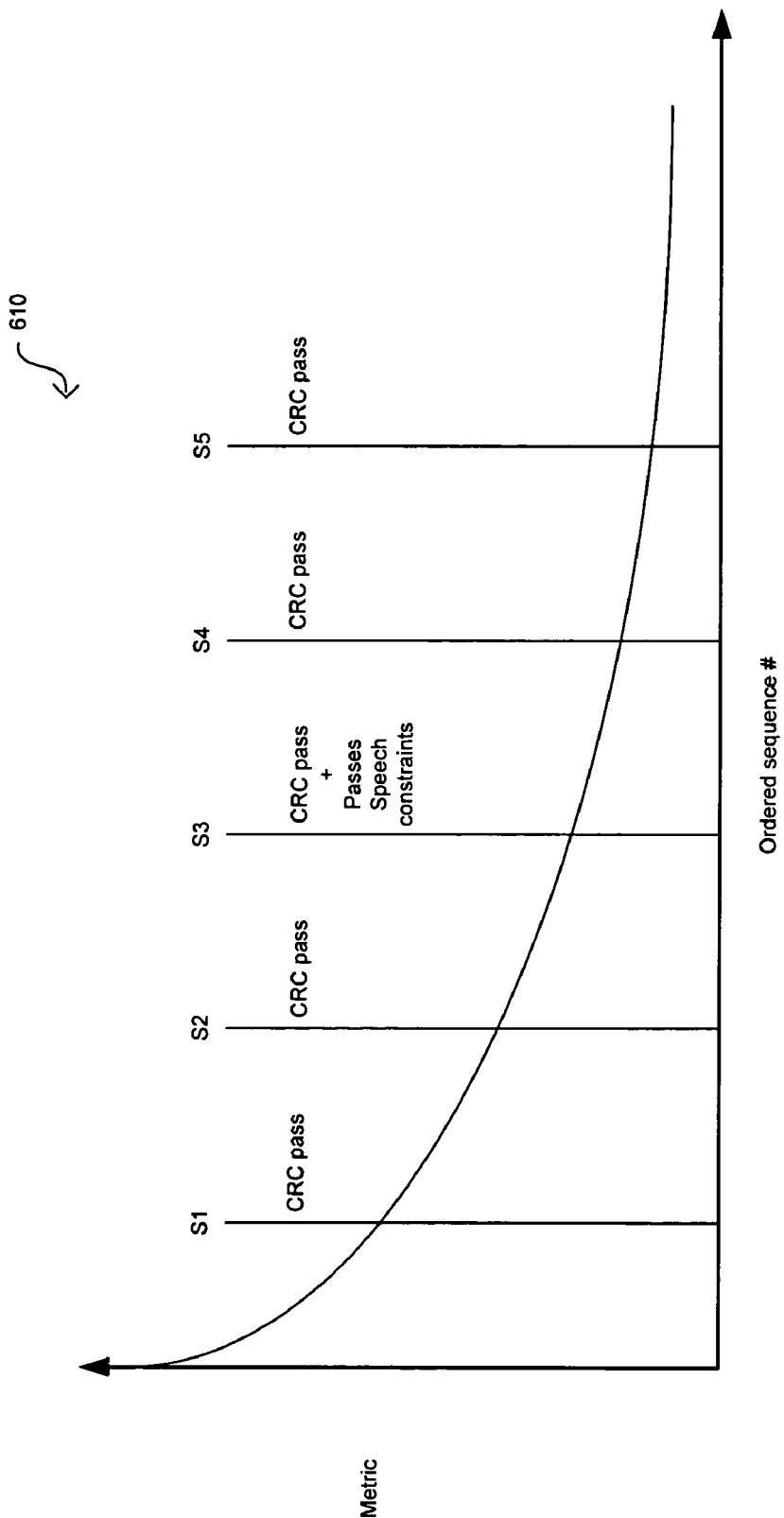
FIG. 6B is a graph illustrating exemplary set of sequences that meets CRC and speech constraints, in accordance with an embodiment of the invention.

FIG. 6B is a graph illustrating exemplary set of sequences that meets CRC and speech constraints, in accordance with an embodiment of the invention. Referring to FIG. 6B, there is shown the result of the redundancy algorithm. For example, the search process for T hypothesis as shown in FIG. 6A may result in the set of bit sequences {S1, S2, S3, S4, and S5}. These bit sequences may be selected based on their metric values and passing the CRC verification. The set of bit sequences were also required to pass physical constraint tests as described herein. In this instance, the bit sequence S3 has been shown to meet the CRC verification and the physical constraint test and may be selected as the best bit sequence, Sb.

Figure 7:
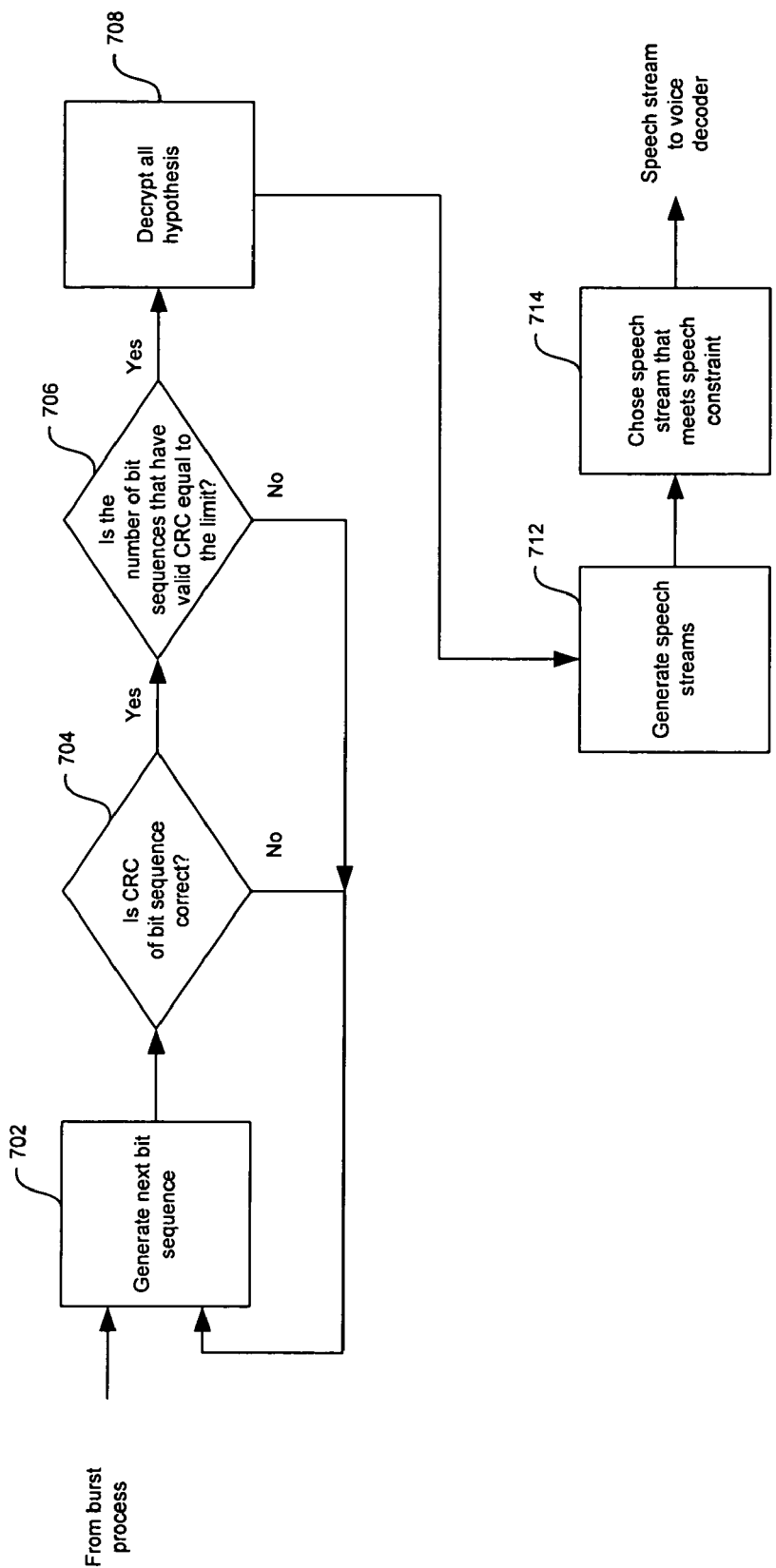
FIG. 7 is a flow chart illustrating exemplary steps for generating a speech stream in a GSM receiver, in accordance with an embodiment of the invention.

FIG. 7 is a flow chart illustrating exemplary steps for generating a speech stream in a GSM receiver, in accordance with an embodiment of the invention. Referring to FIG. 7, in step 702, data may be received from a burst process and a bit-sequence may be generated by, for example, utilizing a modified Viterbi algorithm. The convolutional decoder 202 in FIG.

2A, for example, may generate the bit-sequence. In step 704, a CRC may be generated for the bit-sequence and the generated CRC may be compared to the CRC that was transmitted with the data. The CRC verification block 204 may be utilized to verify the CRC in step 704. If the CRCs are not the same, the next step may be step 702 where a new bit-sequence may be generated. If the CRCs are the same, the next step may be step 706.

In step 706, the number of bit-sequences with valid CRCs may be evaluated in order to determine whether it is a maximum number allowed. If there are less than a maximum number of bit-sequences with valid CRCs, then the next step may be step 702 where a new bit-sequence may be generated. Otherwise, the next step may be step 708. In step 708, the bit-sequence from step 706 may be decrypted by, for example, the decryption block 206 in FIG. 2A. The decryption may comprise, for example, exclusive-ORing the data in the bit-sequence with a decryption key. The decryption key may be, for example, the same as the encryption key that may have been used to encrypt the transmitted data. The next step may be step 712 where the speech stream may be generated from the decrypted bit-sequence or stream that results in step 708.

In step 714, the speech streams generated in step 712 may be tested by speech constraints. Speech constraints may be, for example, gain continuity and smoothness in inter-frames or intra-frames, pitch continuity in voice inter-frames or intra-frames, and/or consistency of line spectral frequency (LSF) parameters that are utilized to represent a spectral envelope. A single speech stream may be selected based on the speech constraints. The speech stream may be decoded by, for example, the voice decoder 210 in FIG. 2A in accordance with the appropriate speech coding, such as AMR, FR, and/or EFR, for example.

Figure 8:
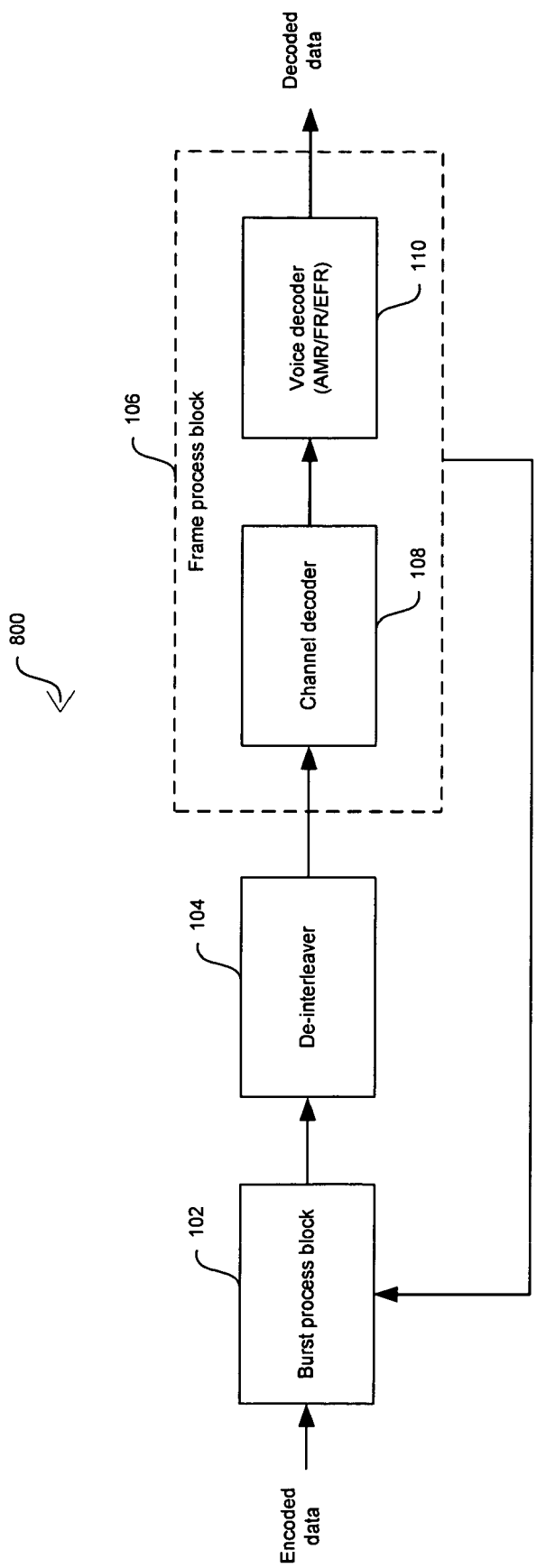
FIG. 8 is a block diagram illustrating an iterative multilayer approach for improving processing of GSM speech data, in accordance with an embodiment of the invention.

FIG. 8 is a block diagram illustrating an iterative multilayer approach for improving processing of GSM speech data, in accordance with an embodiment of the invention. Referring to FIG. 8, there is shown the receiver 100 in FIG. 1A with a feedback signal from the frame process portion of the multilayer decoding approach to the burst process portion of the multilayer decoding approach. The frame process may comprise the use of redundancy verification of the results generated by the Viterbi algorithm and the use of physical constraints to reduce decoding errors that may result from the standard Viterbi algorithm. The burst process may utilize information decoded in the frame process as an input to improve the channel estimation and channel equalization operations. The U.S. application Ser. No. 11/189,634 filed on Jul. 26, 2005, which discloses a method and system for improving reception of wired and wireless receivers through redundancy and iterative processing is hereby incorporated herein by reference in its entirety.

Figure 9:
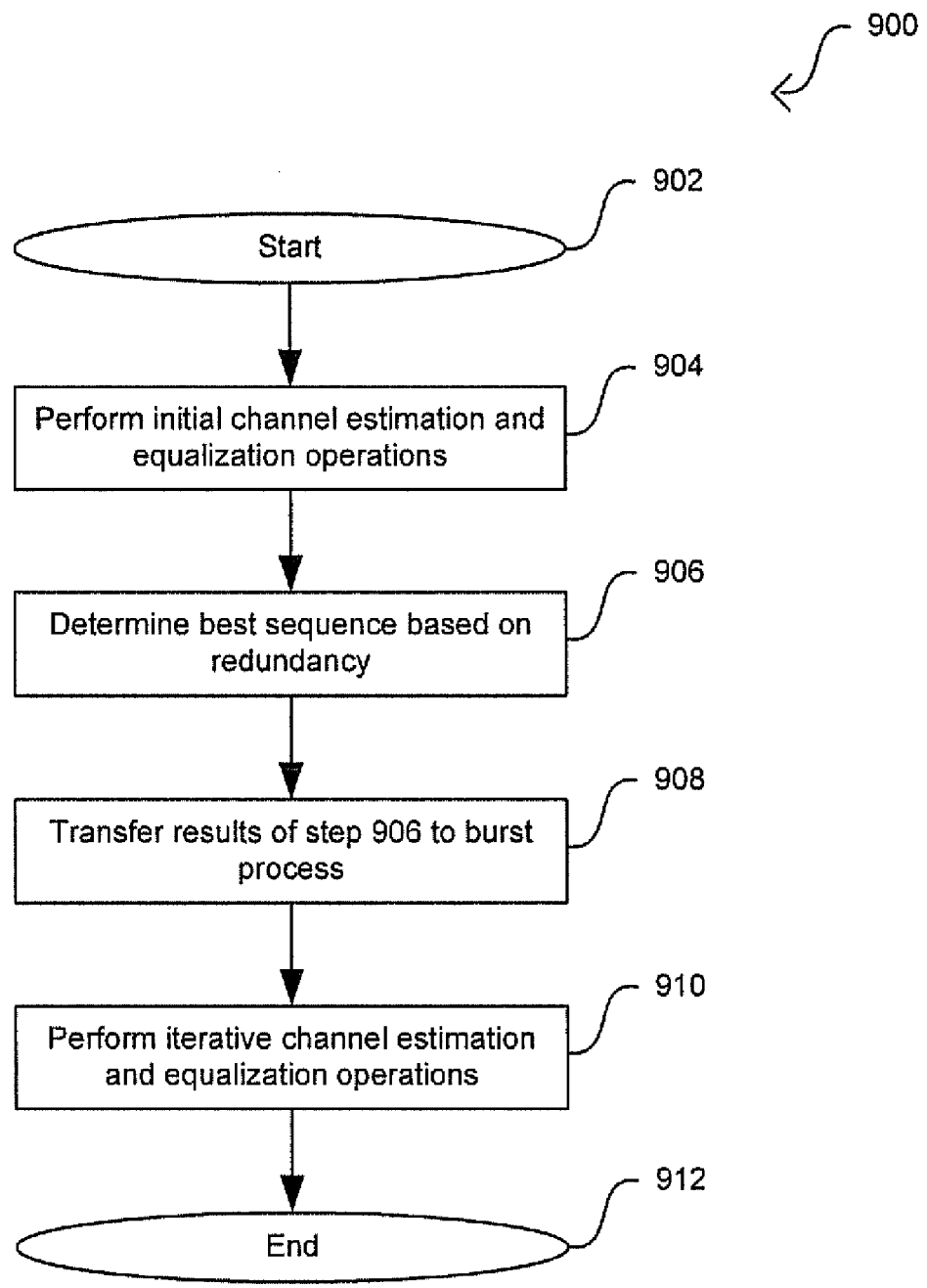
FIG. 9 is a flow diagram illustrating exemplary steps in the iterative multilayer approach for improving processing of GSM speech data, in accordance with an embodiment of the invention.

FIG. 9 is a flow diagram illustrating exemplary steps in the iterative multilayer approach for improving processing of GSM speech data, in accordance with an embodiment of the invention. Referring to FIG. 9, after start step 902, in step 904, an initial or first iteration of a channel estimation operation and of an equalization operation may be performed on received signals during a burst process portion of the multilayer decoding approach. The first iteration of the channel estimation operation and the first iteration of the equalization operation may be performed by, for example, the burst process block 102 in FIG. 8. In step 906, decoding of a received signal frame may be performed during the frame processing portion of the multilayer decoding approach. The frame processing may be performed by, for example, the frame process block 106 in FIG. 8. In step 908, at least a portion of the results generated in step 906 by the frame process portion of the multilayer decoding approach may be transferred from, for example, the frame process block 106 to the burst process block 102 via a feedback signal. In step 910, the burst processing may perform a second iteration of the channel estimation operation and a second iteration of the equalization operation based on the decoded results provided from the frame process portion of the multilayer decoding approach. After step 910, the flow diagram 900 may proceed to end step 912. The improved results of the burst process may be further interleaved and processed by the frame process. The frame process may utilize a standard frame process or determine the best sequence that may be utilized based on, for example, redundancy.

The iterative multilayer approach described in FIG. 9 may be utilized in a many different applications, for example, in digital video broadcasting (DVB), digital audio broadcasting (DAB), and in wireless applications, such as those that support 2G, 2.5G and 3G technologies. In this regard, the iterative multilayer approach may be utilized in GSM applications, for example.

Figure 10:
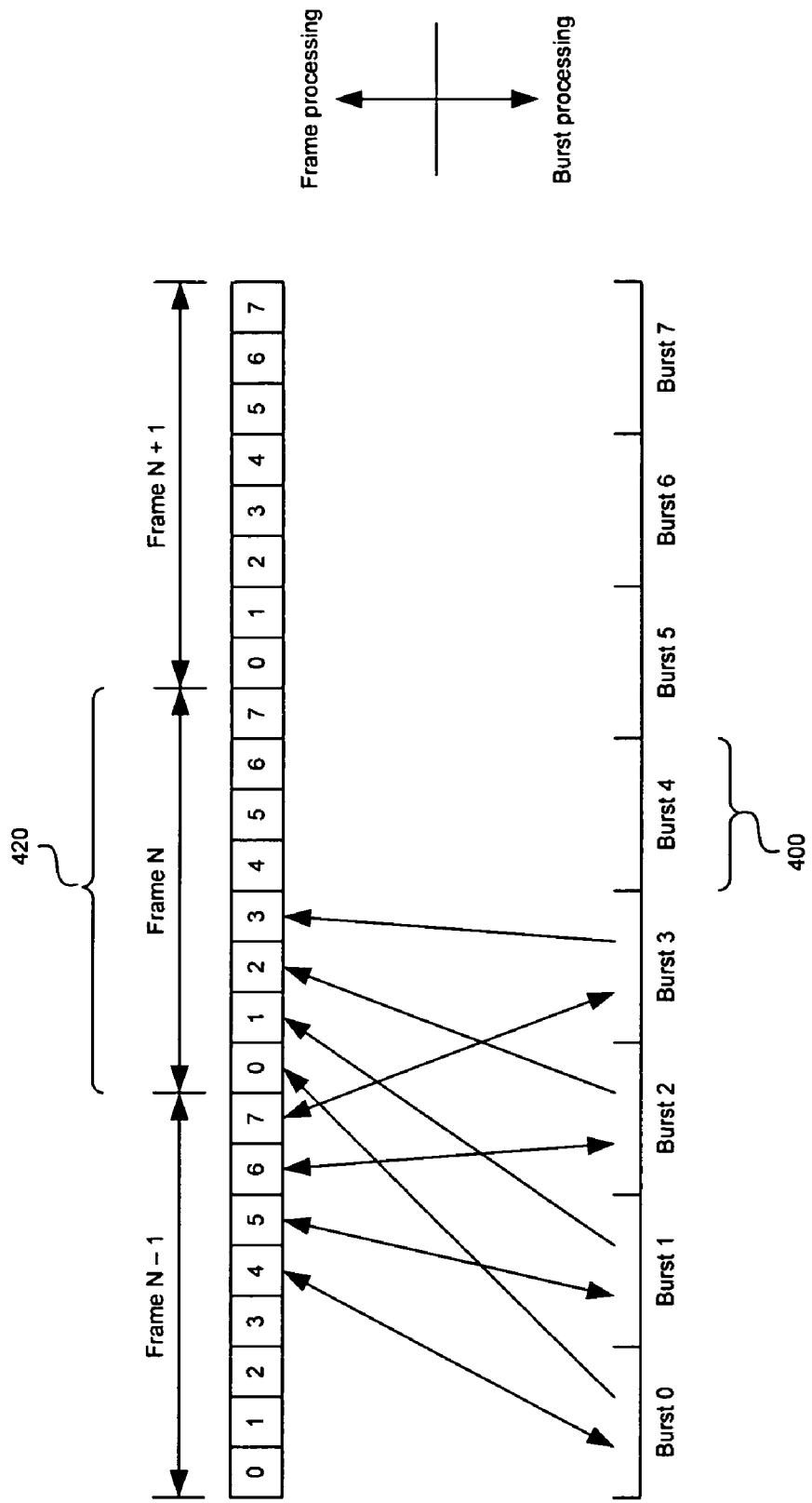
FIG. 10 is a diagram illustrating exemplary iterative frame and burst processes in GSM applications, in accordance with an embodiment of the invention.

FIG. 10 is a diagram illustrating exemplary iterative frame and burst processes in GSM applications, in accordance with an embodiment of the invention. Referring to FIG. 10, there is shown a series of at least one time slot burst 400 and a series of at least one frame 420 as illustrated in FIG. 4. The series of at least one time slot burst 400 may correspond to Burst 0 through Burst 7, while the series of at lest one frame 420 may correspond to Frame N−1 through Frame N+1.

There may be two types of iterative processes to consider: a causal iterative process and a non-causal iterative process. For the causal iterative process, Burst 0 through Burst 3 may each have 57 data bits from the first data bits 404 portion of the time slot burst 400 that have been decoded during the frame processing of Frame N−1. Utilizing the decoded 57 data bits in each of Burst 0 through Burst 3 and the 26 bits in the midamble 408, the burst process may be recalculated or a second iteration of the burst process may occur. In this regard, the channel estimation operation of the burst process may be improved by utilizing the decoded data bits generated by the frame process during a second iteration. Moreover, the MLSE in the channel equalization operation of the burst process may consider that the decoded data bits are known with a higher probability than during the first iteration. In some instances, to reduce the complexity that may be introduced by a second iteration operation, the burst process may be adapted to perform a second iteration on selected time slot bursts determined during the first iteration. In this regard, a particular time slot burst may be selected for a second iteration when it is associated with having a low carrier-to-interference (C/I) value, for example. Once the burst process improves the data, it may be further interleaved and processed by the frame process. The frame process my use a standard frame process or determine the best sequence based on, for example, the redundancy For the non-causal iterative process, bits from Burst 0 through Burst 7 may be needed to recalculate the burst process for bit sequences that may be transferred to Frame N. Data from Frame N−1 and/or data from Frame N+1 may be utilized to calculate the burst process for bit sequences that may be transferred to Frame N. Utilizing the decoded 114 data bits in each of Burst 0 through Burst 7 and the 26 bits in the midamble 408, the burst process may be recalculated. As with the causal iterative process, a particular time slot burst may be selected for a second iteration when it is associated with having a low carrier-to-interference (C/I) value, for example.

While the approach described in FIG. 10 is suitable for GSM applications that utilize GSMK modulation, the invention need not be so limited. Substantially similar causal and/or non-causal iterative processes may also be implemented for iterative systems in GSM applications, such as EDGE, that utilize a 156-symbol or a 157-symbol time slot burst suitable for 8-PSK modulation.

The approach described herein may result in fewer decoding bit errors than may occur from the use of a standard Viterbi algorithm. In this regard, the use of a multilayer process or an iterative multilayer process that utilizes redundancy and physical constraints may be efficiently implemented in the design of optimized receivers that decode interdependent signals, such as convolutional encoded data, in GSM applications that utilize AMR, FR, and/or EFR speech coding. However, the invention need not be so limited and may be utilized for TDMA speech applications that utilize AMR, FR, and/or EFR speech coding.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   generating a decoded bit-sequence for received TDMA speech data;
   generating a speech stream that satisfies at least one speech constraint, based on said decoded bit-sequence; and
   decoding said generated speech stream by a TDMA voice decoder, wherein said decoding of said generated speech stream by said TDMA voice decoder comprises one or more of adaptive multi-rate (AMR) speech decoding operations, full rate (FR) speech decoding operations, and enhanced full rate (EFR) decoding operations.

2. The method according to claim 1, wherein said generating of said decoded bit-sequence for received TDMA speech data comprises decoding said received TDMA speech data utilizing a Viterbi algorithm.

3. The method according to claim 1, comprising verifying a CRC for said decoded bit-sequence.

4. The method according to claim 1, comprising feeding back estimates of said decoded bit-sequence for subsequent decoding of said received TDMA speech data.

5. The method according to claim 1, wherein said at least one speech constraint comprises gain continuity.

6. The method according to claim 1, wherein said at least one speech constraint comprises pitch continuity.

7. The method according to claim 1, wherein said TDMA speech data comprises GSM speech data.

8. A machine-readable storage having stored thereon, a computer program having at least one code section for signal processing, the at least one code section being executable by a machine for causing the machine to perform steps comprising:
   generating a decoded bit-sequence for received TDMA speech data;
   generating a speech stream that satisfies at least one speech constraint, based on said decoded bit-sequence; and
   decoding said generated speech stream by a TDMA voice decoder, wherein said decoding of said generated speech stream by said TDMA voice decoder comprises one or more of adaptive multi-rate (AMR) speech decoding operations, full rate (FR) speech decoding operations, and enhanced full rate (EFR) decoding operations.

9. The machine-readable storage according to claim 8, wherein said generating of said decoded bit-sequence for received TDMA speech data comprises decoding said received TDMA speech data utilizing a Viterbi algorithm.

10. The machine-readable storage according to claim 8, wherein said at least one code section comprises code for verifying a CRC for said decoded bit-sequence.

11. The machine-readable storage according to claim 8, wherein said at least one code section comprises code for feeding back estimates of said decoded bit-sequence for subsequent decoding of said received TDMA speech data.

12. The machine-readable storage according to claim 8, wherein said at least one speech constraint comprises gain continuity.

13. The machine-readable storage according to claim 8, wherein said at least one speech constraint comprises pitch continuity.

14. The machine-readable storage according to claim 8, said TDMA speech data comprises GSM speech data.

15. A system for signal processing, the system comprising:
   a frame processor that enables generating a decoded bit-sequence for received TDMA speech data;
   said frame processor enables generating, based on said decoded bit-sequence, a speech stream that satisfies at least one speech constraint; and
   said frame processor enables decoding said generated speech stream by a TDMA voice decoder, wherein said TDMA voice decoder enables one or more of adaptive multi-rate (AMR) speech decoding operations, full rate (FR) speech decoding operations, and enhanced full rate (EFR) decoding operations.

16. The system according to claim 15, wherein said frame processor enables decoding said received TDMA speech data utilizing a Viterbi algorithm.

17. The system according to claim 15, wherein said frame processor enables verifying a CRC for said decoded bit-sequence.

18. The system according to claim 15, wherein said frame processor enables feeding back estimates of said decoded bit-sequence for subsequent decoding of said received TDMA speech data.

19. The system according to claim 15, wherein said at least one speech constraint comprises gain continuity.

20. The system according to claim 15, wherein said at least one speech constraint comprises pitch continuity.

21. The system according to claim 15, wherein said TDMA speech data comprises GSM speech data.

* * * * *